(12) United States Patent
Solum

(10) Patent No.: US 7,664,211 B2
(45) Date of Patent: Feb. 16, 2010

(54) AUTOMATIC GAIN CONTROL WITH OUT OF BAND BLOCKING SIGNAL COMPENSATION

(75) Inventor: Jeffrey Paul Solum, Deephaven, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 599 days.

(21) Appl. No.: 11/539,524

(22) Filed: Oct. 6, 2006

(65) Prior Publication Data

US 2007/0110193 A1 May 17, 2007

Related U.S. Application Data

(60) Provisional application No. 60/724,636, filed on Oct. 7, 2005.

(51) Int. Cl.
*H04L 27/08* (2006.01)
(52) U.S. Cl. .......... 375/345; 375/346; 455/63.1; 455/67.11; 455/574; 455/234.1; 455/239.1; 370/318
(58) Field of Classification Search ........ 375/285, 375/317, 345, 346; 455/13.4, 63.1, 67.11, 455/574, 226.1, 226.2, 226.4, 232.1, 234.1, 455/240.1, 239.1, 250.1; 370/318; 327/50
See application file for complete search history.

(56) References Cited

U.S. PATENT DOCUMENTS 4,499,586 A    2/1985    Cafarella et al.
5,371,734 A    12/1994   Fischer
5,784,402 A    7/1998    Feher
6,081,558 A    6/2000    North
6,445,749 B2   9/2002    Feher
6,470,055 B1   10/2002   Feher
6,532,358 B1 * 3/2003    Earls et al. ............... 455/234.1
6,628,932 B1 * 9/2003    Myers ..................... 455/234.1
6,665,348 B1   12/2003   Feher (Continued)

FOREIGN PATENT DOCUMENTS

EP          681763 B1      8/2001

(Continued)

OTHER PUBLICATIONS

"International Application Serial No. 06255198.1, Extended European Search Report mailed Apr. 10, 2008", 9 pgs.

(Continued)

*Primary Examiner*—Dac V Ha
(74) *Attorney, Agent, or Firm*—Schwegman, Lundberg & Woessner, P.A.

(57) ABSTRACT

One embodiment of the present subject matter includes a method of receiving an input signal. The method, in various embodiments, includes detecting a peak of the input signal and detecting an envelope of the input signal. In various embodiments, the peak and envelope are used to identify out-of-band blocking signals and to adjust gain control. The method also includes comparing the peak to a first threshold Tp and comparing the envelope to a second threshold Te. In the method, if the peak is above the first threshold and the envelope is below the second threshold, then ignoring the input signal. If the envelope is above the second threshold, the method includes applying automatic gain control to decode information encoded in the input signal.

30 Claims, 8 Drawing Sheets

U.S. PATENT DOCUMENTS

| | | | |
|---|---|---|---|
| 6,721,547 B2 * | 4/2004 | Husted et al. | 455/226.1 |
| 6,757,334 B1 | 6/2004 | Feher | |
| 6,993,291 B2 * | 1/2006 | Parssinen et al. | 455/67.11 |
| 7,218,911 B2 * | 5/2007 | Shohara et al. | 455/343.1 |
| 7,227,916 B2 * | 6/2007 | Ruelke et al. | 375/345 |
| 7,463,872 B2 * | 12/2008 | Jin et al. | 455/245.1 |
| 7,548,738 B2 * | 6/2009 | Srinivasan et al. | 455/232.1 |
| 2001/0002202 A1 | 5/2001 | Feher | |
| 2002/0090966 A1 | 7/2002 | Hansen et al. | |
| 2002/0181547 A1 | 12/2002 | Feher | |
| 2003/0012313 A1 | 1/2003 | Husted et al. | |
| 2003/0048834 A1 | 3/2003 | Feher | |
| 2004/0029623 A1 | 2/2004 | Ellis et al. | |
| 2004/0162043 A1 | 8/2004 | Taubenheim et al. | |
| 2004/0196923 A1 | 10/2004 | Feher | |
| 2004/0208243 A1 | 10/2004 | Feher | |

FOREIGN PATENT DOCUMENTS

| | | |
|---|---|---|
| EP | 1154581 A2 | 11/2001 |
| EP | 1179887 A2 | 2/2002 |
| WO | WO-00/10272 A1 | 2/2000 |
| WO | WO-2004047323 A1 | 6/2004 |
| WO | WO-2004/086654 A1 | 10/2004 |
| WO | WO-2006107450 A2 | 10/2006 |

OTHER PUBLICATIONS

"European Application Serial No. 06255198.1, Office Action mailed Aug. 20, 2008", 1 pg.

* cited by examiner

AUTOMATIC GAIN CONTROL WITH OUT OF BAND BLOCKING SIGNAL COMPENSATION

RELATED APPLICATION

This application claims priority under 35 U.S.C. 119(e) to U.S. Provisional Application Ser. No.: 60/724,636, filed Oct. 7, 2005, which application is incorporated herein by reference.

FIELD OF THE INVENTION

The present disclosure relates to radio frequency communications, and in particular to gain control in radio frequency communications.

BACKGROUND

As wireless devices become more commonplace, the probability of signal interference from multiple radio sources increases. If the gain of a receiver is not properly adjusted for incoming signal strength of the desired signal, the receiver may be improperly insensitive or overly sensitive. An overly insensitive receiver is likely to be a poor receiver of a low level desired signal. An overly sensitive receiver is more susceptible to noise interference. Strong signals from undesired sources also increase the chances of poor reception due to unwanted overloading of the front end receiver which increases the chances of incorrect signal detection.

Wireless devices are becoming more portable as circuits become more compact and power efficient. Such designs often feature low power transmitters and receivers to conserve battery power while maintaining useful communications.

What is needed in the art is a receiver system which automatically adjusts its gain to maintain a good signal-to-noise ratio based a changing radio frequency environment. Such a system should account for interference from undesired radio frequency sources which can overload the receiver system. Such a system should be realizable in low power embodiments to provide improved reception by battery powered devices.

SUMMARY

The above-mentioned problems and others not expressly discussed herein are addressed by the present subject matter and will be understood by reading and studying this specification.

One embodiment of the present subject matter includes a method of receiving an input signal. The method, in various embodiments, includes detecting a peak of the input signal and detecting an envelope of the input signal. The detection can provide useful information to determine the presence of an out-of-band blocking signal. In various embodiments, the receiver can take different actions based on the presence or absence of what is deemed to be an out-of-band blocking signal. The peak and envelope detector can be used to perform other gain control methods described herein.

In various embodiments, a method includes comparing the peak to a first threshold Tp and comparing the envelope to a second threshold Te. In the method, if the peak is above the first threshold and the envelope is below the second threshold, then ignoring the input signal. If the envelope is above the second threshold, the method includes applying automatic gain control to decode information encoded in the input signal. In various embodiments, subject matter is included wherein the applying includes reducing gain of a receiver front end when the peak is above the first threshold. In some embodiments, if the peak is not above the first threshold, the method detects information encoded in the input signal. In some embodiments, detecting information comprises applying automatic gain control.

The present subject matter also includes an apparatus which includes a peak detector adapted to receive signals from the receiver front end; and an envelope detector adapted to receive signals from the receiver intermediate frequency stage. The apparatus detects an out of band blocking signal based on outputs from the peak detector and the envelope detector. Some embodiments of the present subject matter include a filter stage following the receiver front end, and an envelope detector adapted to receive signals from the filter stage.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

BRIEF DESCRIPTION OF THE DRAWINGS

Various embodiments are illustrated by way of example in the figures of the accompanying drawings. Such embodiments are demonstrative and not intended to be exhaustive or exclusive embodiments of the present subject matter.

DETAILED DESCRIPTION

The following detailed description of the present invention refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and therefore and not exhaustive, and the scope of the present subject matter is defined by the appended claims and their legal equivalents.

The present system provides method and apparatus for automatic gain control which accounts for undesired radio frequency sources. One such source is an out of band blocking signal which can overload a receiver's front end and diminish sensitivity and reception of the receiver. In various embodiments, the present system provides a robust receiver design which can be applied in low power radio frequency environments. One application of the present system provides automatic gain control which adjusts gain for cases where out of band blocking signals are present.

Figure 1:
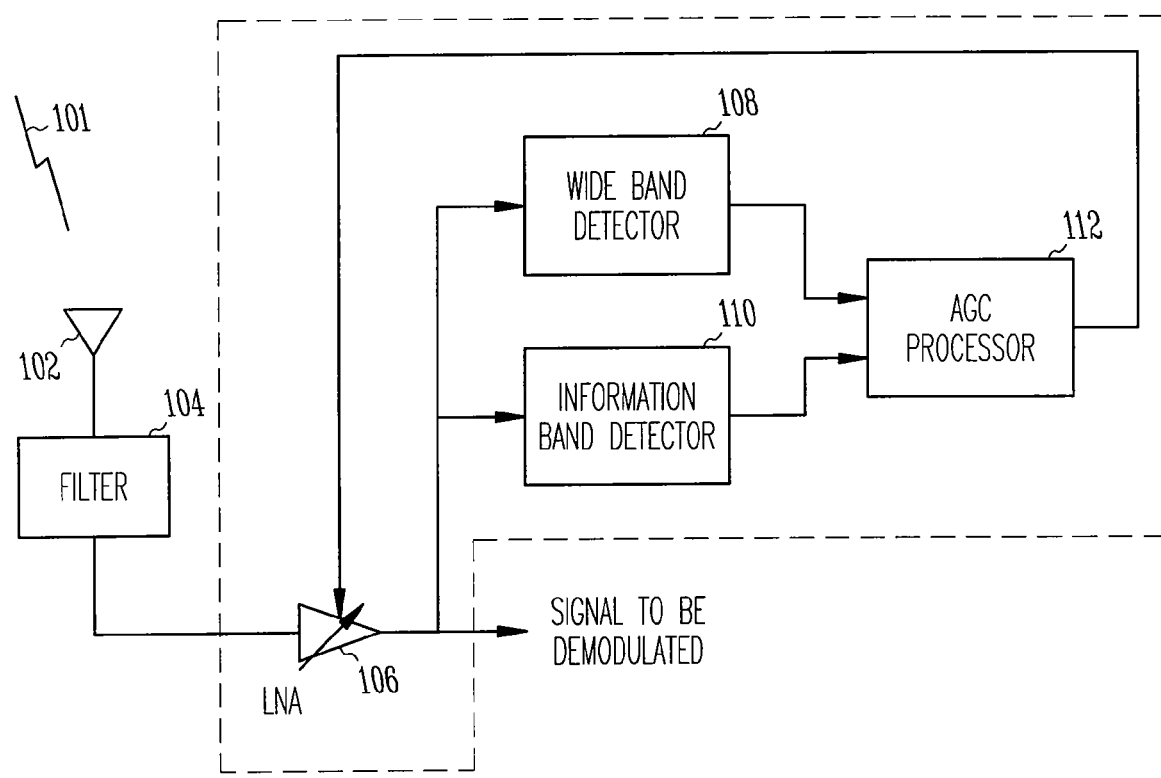
FIG. 1 shows one example of an automatic gain control for a receiver according to one embodiment of the present subject matter.

FIG. 1 shows one example of an automatic gain control for a receiver according to one embodiment of the present subject matter. The antenna 102 receives incoming radio signals 101 that are filtered by filter 104 and passed to a low noise amplifier (LNA) 106 for amplification. Wideband detector 108 and information band detector 110 process the amplified signals to provide information to the automatic gain control processor (AGC processor) 112. The information band detector 110 includes the necessary circuitry to detect the signal of interest from the amplified signals. Information band detector 110 then provides an output to the AGC processor 112 indicative of the presence of energy in the band of interest. The wideband detector 108 has a bandwidth which is relatively large compared to the information band detector 110. It indicates the presence of energy in general from the amplified signals. The outputs of the wideband detector 108 and information band detector 110 are used by AGC processor 112 to adjust the gain of LNA 106. In one embodiment, this gain adjustment is done before the LNA. In one embodiment, this gain adjustment is done after the LNA. The adjustment depends on the LNA linearity and design goals. The output of LNA 106 also provides a signal to be demodulated by the receiver. It is understood that different receiver demodulation approaches are available for use without departing from the scope of the present subject matter. Such approaches include, but are not limited to superheterodyne (examples include FIGS. 3 and 4), direct RF demodulation (one example is FIG. 7, and direct conversion receiver to DC (receiver to DC conversion example in FIG. 8). Other approaches are possible without departing from the scope of the present subject matter.

Thus, the outputs of the wideband detector 108 and information band detector 110 indicate whether the amplified signals are indicating wideband energy and indicating energy in the band of the signal of interest. This information is used by AGC processor 112 to determine a course of action for the automatic gain control to take. In various embodiments, AGC processor 112 samples the outputs of wideband detector 108 and information band detector 110 simultaneously. In various embodiments, AGC processor 112 samples the outputs of wideband detector 108 and information band detector 110 sequentially. In some such embodiments, a switch and one or more analog to digital conversions are done to read the outputs. Other ways and circuits for processing the detector information are possible without departing from the scope of the present subject matter. In various embodiments, the LNA 106 will exhibit "quieting" of the signal in the desired band on overload of the receiver front end.

In one embodiment, the wideband detector 108 compares the detected wideband energy to a predetermined threshold to indicate whether the incoming signal has a substantial amount of wideband energy. In various embodiments the predetermined threshold is programmable. In various embodiments the predetermined threshold is set. In various embodiments, a plurality of outputs indicate the amount of wideband energy detected. In various embodiments the wideband detector 108 outputs Boolean states to indicate relatively high or relatively low detections of wideband energy. In various embodiments, more than two states are used to indicate the amount of wideband energy. Various embodiments provide a relative approach to determinations of the wideband energy. Various embodiments provide an absolute reference of wideband energy. Various embodiments employ filtering of the detection signal to condition the outputs of the wideband detector 108. It is understood that the outputs of the wideband detector 108 may vary without departing from the scope of the present subject matter.

In one embodiment, the information band detector 110 compares the detected information band energy to a predetermined threshold to indicate whether the incoming signal has a substantial amount of information band energy. In various embodiments the predetermined threshold is programmable. In various embodiments the predetermined threshold is set. In various embodiments, a plurality of outputs indicate the amount of information band energy detected. In various embodiments the information band detector 110 outputs Boolean states to indicate relatively high or relatively low detections of wideband energy. In various embodiments, more than two states are used to indicate the amount of information band energy. Various embodiments provide a relative approach to determinations of the information band energy. Various embodiments provide an absolute reference of information band energy. Various embodiments employ filtering of the detection signal to condition the outputs of the information band detector 110. It is understood that the outputs of the information band detector 110 may vary without departing from the scope of the present subject matter.

An example of a two state wideband detector 108 and a two state information band detector 110 is provided to illustrate one embodiment, but not intended to limit the present subject matter. In one embodiment the system is programmable to take the following actions based on the determinations of the wideband detector 108 and the information band detector 110, as set forth in TABLE 1:

TABLE 1

One Example of an Automatic Gain Control System

| State | Wideband Detection | Information Band Detection | Probable condition | Action |
| --- | --- | --- | --- | --- |
| 1 | Low | Low | Small or no signal | Increase gain to increase signal-to-noise ratio |
| 2 | Low | High | Good signal strength | Lower or raise gain as needed to maximize signal-to-noise ratio |
| 3 | High | Low | Out of band blocking signal and low or no inband signal | Lower gain to decrease possibility of overloading front end and to increase signal-to-noise ratio of information band signal |

TABLE 1-continued

One Example of an Automatic Gain Control System

| State | Wideband Detection | Information Band Detection | Probable condition | Action |
|---|---|---|---|---|
| 4 | High | High | Good signal strength | Lower or raise gain as needed to maximize signal-to-noise ratio |

The present subject matter in various embodiments is able to identify whether the receiver is detecting low or no signal as compared to good signal. The system is also able to adjust gain to compensate for occurrences of an unwanted blocking of incoming signals due to an out of band blocking effect. This is largely due to overloading of the receiver "front end" with a signal from a transmission source of a frequency outside the range of the frequencies of interest. These "out of band blockers" will prevent the receiver from misinterpreting the received energy when the "out of band blocker" signal dominates the reception capabilities of the receiver. In various embodiments, the present system is able to increase gain for weak received signals and decrease gain for strong desired received signals to maximize the receiver's ability to accurately receive data. Thus, in one embodiment, the receiver is placed in one of four modes of TABLE 1 depending on the input signal.

State 1

If the wideband detection is below a first threshold and the information band or narrowband detection is below a second threshold, the input signal is deemed to be weak or absent. The receiver indicates that no intelligible signal is being received and gain may be increased to improve the signal-to-noise ratio.

State 2

If the wideband detection is below a first threshold and the information band detection is above a second threshold, the input signal is deemed to be a good signal and gain of the input stage of the receiver is decreased or increased to improve signal-to-noise ratio. The resulting input signal is detected.

State 3

If the wideband detection is above a first threshold and the information band detection is below a second threshold, the input signal is deemed to be blocked due to an out of band blocker. The input signal is not detected since the receiver "front end" is deemed to be overloaded and the signal is too weak due to quieting of the LNA. Gain is decreased to attempt to detect a good signal.

State 4

If the wideband detection is above a first threshold and the information band detection is above a second threshold, the incoming signals probably include an out of band blocking signal, but the signal of interest is detectable. Thus, the resulting input signal is detected.

Thus, according to varying embodiments, the receiver is able to discriminate against an overloaded front end of the receiver which normally improves with a reduction of gain and a weaker signal which requires an increase in gain.

In one embodiment, the AGC Processor 112 is programmed to provide gain adjustments according to a predetermined approach. In varying embodiments, the AGC processor 112 is adapted to provide gain adjustments as set forth herein. In varying embodiments, the AGC processor 112 makes adaptive changes as set forth herein. In various embodiments, the AGC processor 112 is a state machine. In various embodiments, AGC processor 112 is realized in logic. In various embodiments, AGC processor 112 is realized by a microprocessor. In various embodiments AGC processor 112 is realized by a microcontroller. In various embodiments, AGC processor 112 is realized in a very large scale integration design (VLSI). Other realizations are possible without departing from the scope of the present subject matter.

Figure 2:
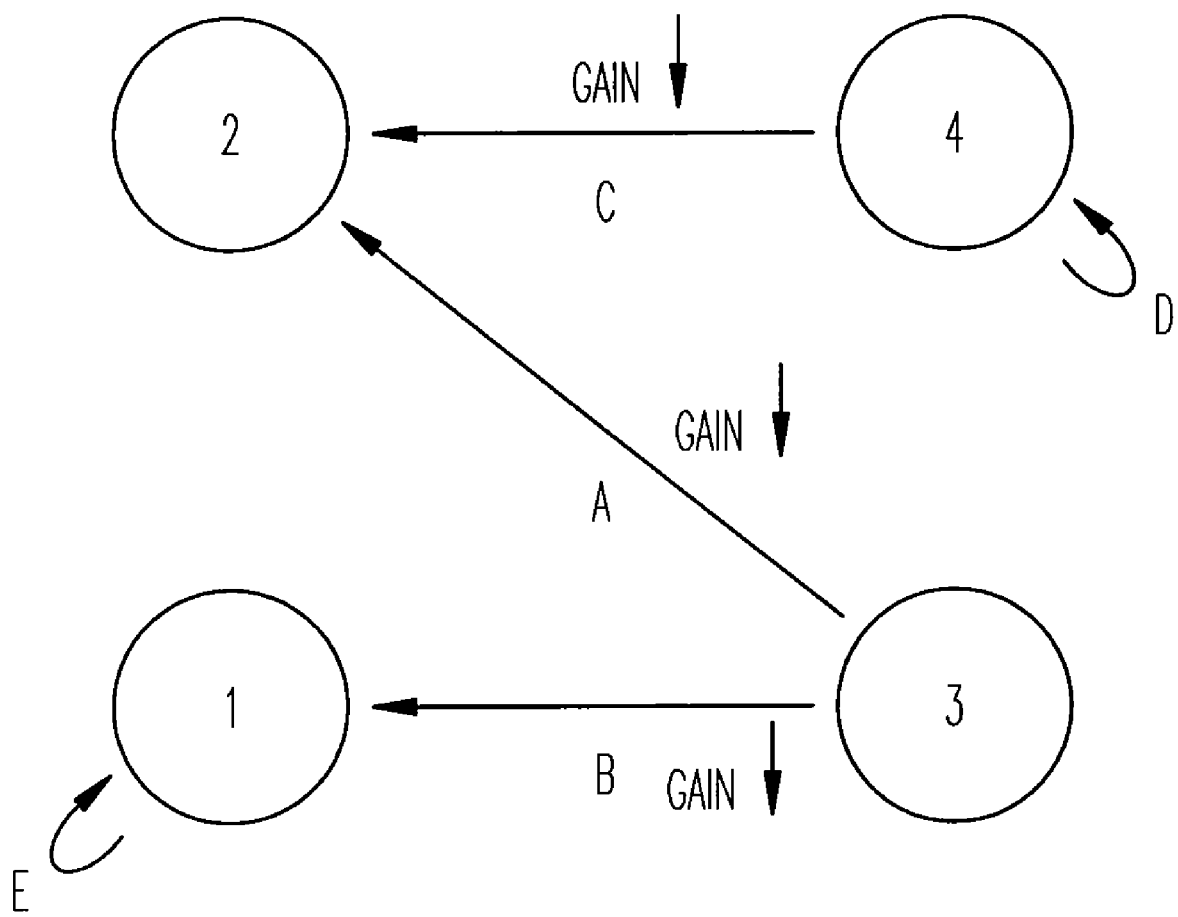
FIG. 2 demonstrates the states of an example system to show possible transitions according to one embodiment of the present subject matter.

FIG. 2 demonstrates the states of TABLE 1 and some possible transitions according to one embodiment of the present subject matter. The gain control will transition from state 3 to state 2 (transition A) by decreasing gain to increase signal to noise ratio. Transition A assumes that the amplifier is saturated in state 3, so lowering gain increases received signal to noise ratio of the information signal. A transition from state 3 to state 1 (transition B) is accomplished by a decrease in gain. A transition from state 4 to state 2 (transition C) is possible upon a decrease in gain. If a change in gain does not change signal to noise ratio, then the system will stay in state 4 (transition D). Likewise if there is no signal detected, the system will return to sleep at state 1 (transition E). Other transitions are possible, depending on signal strengths and threshold settings. For example, A transition from state 2 to state 3 occurs when an out of band blocking signal from a strong undesired signal source decreases signal-to-noise ratio of the receiver at its current gain. A decrease in gain may increase signal-to-noise ratio in presence of the blocker, thus moving the receiver from state 3 to state 4. Should the out of band blocking signal decrease in strength or disappear, the receiver would transition from states 3 or 4 to states 1 or 2 depending on gain and relative signal strengths. Should the out of band blocking signal reappear, the receiver would transition from states 1 or 2 to states 3 or 4, depending on gain and relative signal strengths.

The state of best reception assuming no out of band blocking signal is state 2, which represents good signal-to-noise ratio in the presence of the signal of interest. If an out of band blocking signal is present, then the state of best reception would be state 4, which represents good signal-to-noise ratio in the presence of the signal of interest and the out of band blocking signal.

The systems of FIGS. 1 and 2 are intended only to demonstrate various applications of the system and are not intended to be exclusive or exhaustive of the present teachings. Other embodiments having different states and transitions are possible without departing from the scope of the present subject matter.

Figure 3:
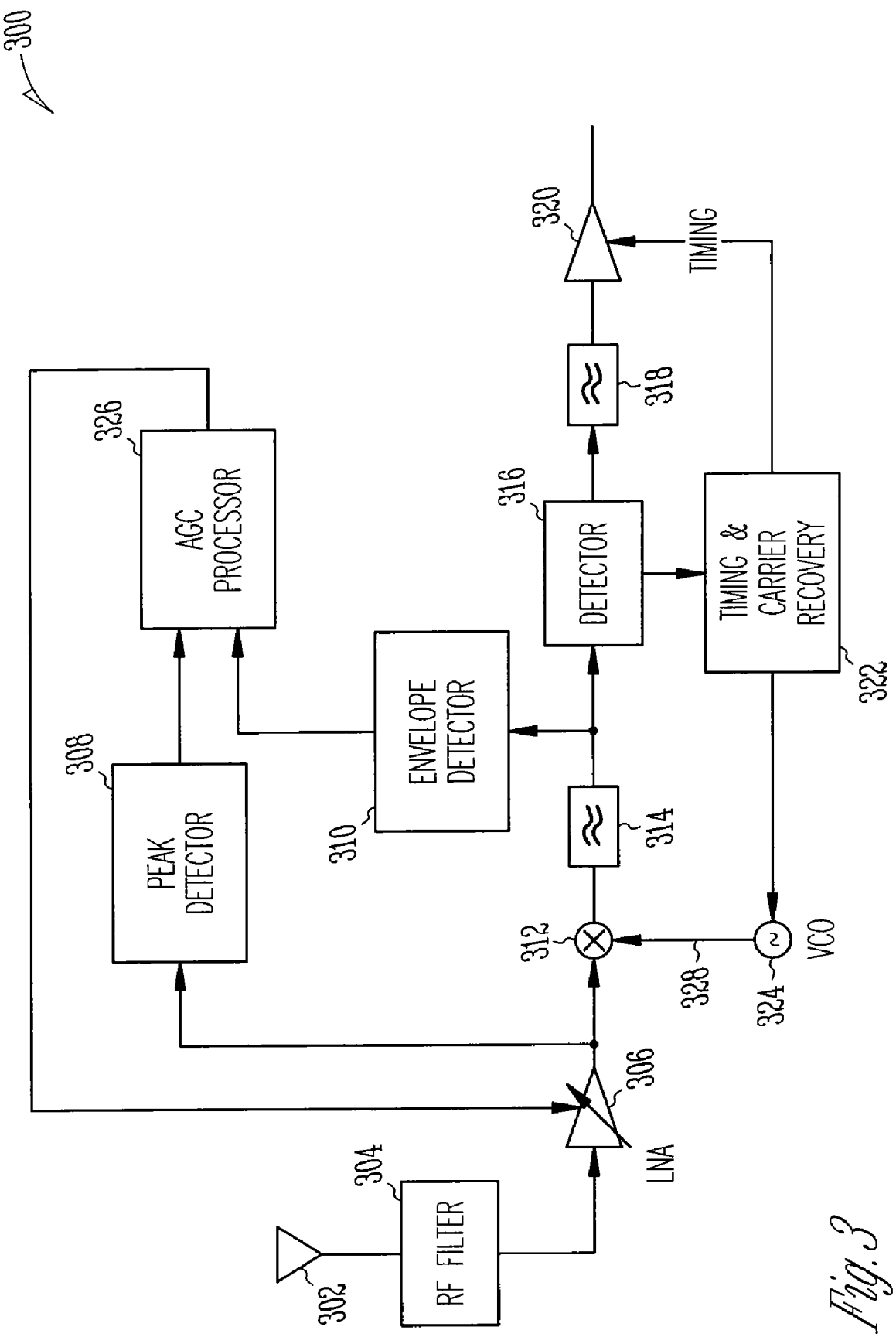
FIG. 3 shows one example of a receiver system according to one embodiment of the present subject matter.

FIG. 3 shows one example of a receiver system according to one embodiment of the present subject matter. In this example, the receiver system 300 is shown, however, it is understood that the system 300 may be embodied in a transceiver or other equipment employing receivers without departing from the scope of the present subject matter. The system 300 includes an antenna 302. In various embodiments, the antenna 302 is connected to the system 300 externally. In various embodiments the antenna 302 is integral to the system 300. Signals from antenna 302 are filtered by radio frequency filter 302 and amplified by low noise amplifier (LNA) 306. It is understood that in some embodiments a filter 302 is not included. One benefit of this design is that the user can mitigate out-of-band interference with or without the use of a front end filter. The amplified signal is detected by peak detector 308 which sends signals to AGC processor 326. The amplified signal is then mixed by mixer 312 with a local oscillator signal 328 commonly found in superheterodyne receiver designs. Other types of receivers include the direct conversion receiver where the IF is at zero Hz or DC (see FIGS. 7 and 8 for some examples). Other receiver designs are possible without departing from the scope of the present subject matter. In the example provided, the output of mixer 312 is a relatively low intermediate frequency signal which is low pass filtered by filter 314. The resulting low pass signal is detected by detector 316 and again low pass filtered by filter 318. In some embodiments, filters 314 and 318 are matched filters. Filter 314 passes information band signals to envelope detector 310, which in turn provides signals to AGC processor 326. AGC processor 326 in turn provides gain signals for LNA 306. In one embodiment, the envelope detector 310 is a received signal strength indicator (RSSI) module for detecting the received signal strength.

In applications where the signal of interest is a digital signal, output amplifier 320 includes an analog-to-digital converter to provide digital data output.

In varying applications, the detector 316 and analog-to-digital converter 320 include outputs which are processed by the timing and carrier recovery module 322 and sent to a voltage controlled oscillator 324 to obtain proper local oscillator frequency mixing signal 328 to be mixed by mixer 312.

Outputs from the peak detector 308 and envelope detector 310 are used by the AGC processor 326 to decide what gain to apply to the LNA 306. It is understood that the peak detector 308 has a passband which is much broader than the passband of the envelope detector 310 and LNA 306. Thus, the output of peak detector 308 is analogous to the output of wideband detector 108 of FIG. 1. The output of envelope detector 310 is analogous to the output of information band detector 110 of FIG. 1. These terms may be used interchangeably in other description and other figures throughout this specification. As discussed in this application, a number of automatic gain control approaches may be used by AGC processor 326, including, but not limited to, the approaches set forth herein.

It is understood that the components, combinations, connections, and types of circuits provided in FIG. 3 are intended as an example, and other variations exist which do not depart from the scope of the present subject matter.

Figure 4:
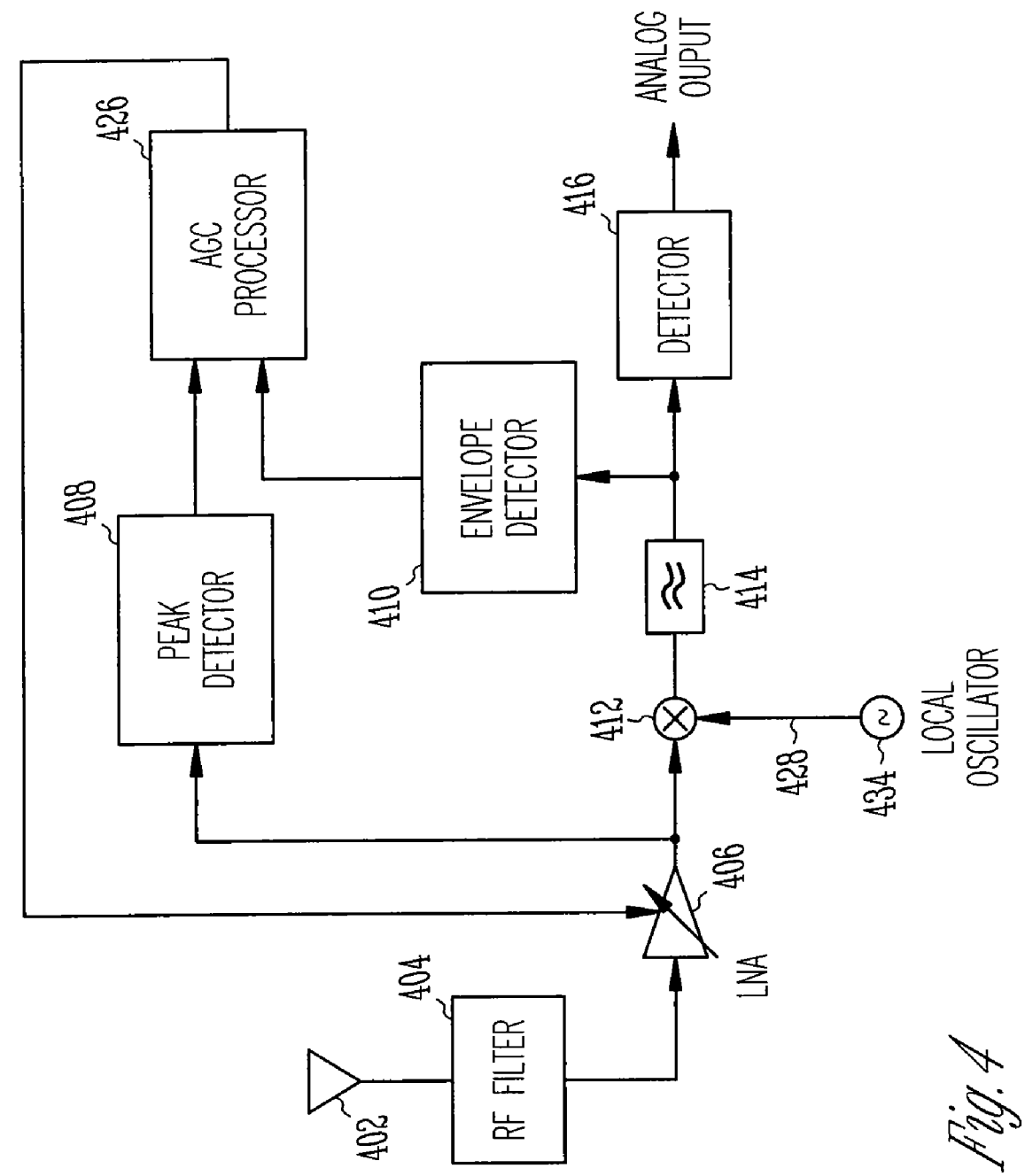
FIG. 4 shows a simplified diagram for applications where the signal of interest is an analog signal, according to one embodiment of the present subject matter.

FIG. 4 shows a simplified diagram for applications where the signal of interest is an analog signal, according to one embodiment of the present subject matter. In this example, the receiver system 400 is shown, however, it is understood that the system 400 may be embodied in a transceiver or other equipment employing receivers without departing from the scope of the present subject matter. The system 400 includes an antenna 402. In various embodiments, the antenna 402 is connected to the system 400 externally. In various embodiments the antenna 402 is integral to the system 400. In one embodiment, signals from antenna 402 are filtered by radio frequency filter 404 and amplified by low noise amplifier (LNA) 406. The amplified signal is detected by peak detector 408 which sends signals to AGC processor 426. The amplified signal is then mixed by mixer 412 with a local oscillator signal 428 commonly found in superheterodyne receiver designs. It is understood that other receiver designs are possible, including direct conversion receiver designs. Some examples are provided in FIGS. 7 and 8. Other receiver designs are possible without departing from the scope of the present subject matter. In the example provided, the output of mixer 412 is a relatively low intermediate frequency signal which is low pass filtered by filter 414. The resulting low pass signal is detected by detector 416. Filter 414 passes information band signals to envelope detector 410, which in turn provides signals to AGC processor 426. AGC processor 426 in turn provides gain signals for LNA 406. In one embodiment, the envelope detector 410 is a received signal strength indicator (RSSI) module for detecting the received signal strength.

In varying applications, the detector 416 provides an analog output.

Outputs from the peak detector 408 and envelope detector 410 are used by the AGC processor 426 to decide what gain to apply to the LNA 406. It is understood that the peak detector 408 has a passband which is much broader than the passband of the envelope detector 410 and LNA 406. Thus, the output of peak detector 408 is analogous to the output of wideband detector 108 of FIG. 1. The output of envelope detector 410 is analogous to the output of information band detector 110 of FIG. 1. As discussed in this application, a number of automatic gain control approaches may be used by AGC processor 426, including, but not limited to, the approaches set forth herein.

It is understood that the components, combinations, connections, and types of circuits provided in FIG. 4 are intended as an example, and other variations exist which do not depart from the scope of the present subject matter.

In various embodiments, the present system provides automatic gain control and power conservation for a receiver adapted to receive bursty communications. In one application the present receiver works in a carrier sense multiple access system. The present system may be employed in other systems, including, but not limited to time division multiple access, code division multiple access, and frequency division multiple access systems.

In various embodiments of the foregoing systems, the RSSI is set at a level sufficient to exceed a noise floor to allow for adequate signal to noise ratio, eg. 10 e −3 Bit error rate. The threshold may be set assuming no out of band blocker and perfect signal coming in. The peak detector is set at a point at which the desired signal may be affected by the nonlinearity of the gain compression from an out of band interferer. Such settings may be circuit specific. In one example, its threshold is set for linearity up to the 1 dB compression point of the receiver front end.

In one application, a low power carrier sense multiple access system (CSMA) is discussed. A CSMA system includes one or more transmitters and one or more receivers. The CSMA transmitters have a detection protocol which provides them an indication of when a particular channel is available for transmission. Upon transmission the CSMA receiver detects a carrier at a predetermined carrier frequency, which is then demodulated to provide information to the receiver over that channel. One such system is the communication system set forth in U.S. Provisional Patent Application Ser. No. 60/687,707, filed Jun. 5, 2005 entitled COMMUNICATION SYSTEM FOR WIRELESS AUDIO DEVICES, which is incorporated herein by reference in its entirety. The present subject matter includes a radio device which can operate in the environments set forth in this provisional patent application. However, this is intended as an example and it is understood that the present subject matter is not limited to such applications.

The CSMA system application of one embodiment of the present subject matter is adapted to low power consumption communications, since the CSMA transmitter does not consume power between its bursty transmissions and because a CSMA receiver can be adapted to receive the bursty transmissions as needed and to conserve power at other times.

A number of problems must be solved to enable proper reception of CSMA transmissions in a low power or ultra low power environment. For instance, in one embodiment the receiver is activated to detect a predetermined carrier frequency at a rate which is commensurate with data transmissions. The CSMA receiver can enter a low power consumption state or "sleep state" between such transmissions and thereby reduce overall power consumption.

Another problem is the discrimination of carrier signals from other signals, such as complications arising from overloading of the front end of the CSMA receiver. Ultra low power receivers typically have low third order intercepts that prevent them from operating in the linear region when the input level is relatively high. In one embodiment, a gain adjustment and detection system is employed which analyzes both short term signal and long term signal behavior to determine an appropriate receiver gain to extend the effective dynamic range of the receiver.

Thus, the environment generally includes multiple transmitters within the reception region of a receiver. Other noise sources are also possible.

Figure 5:
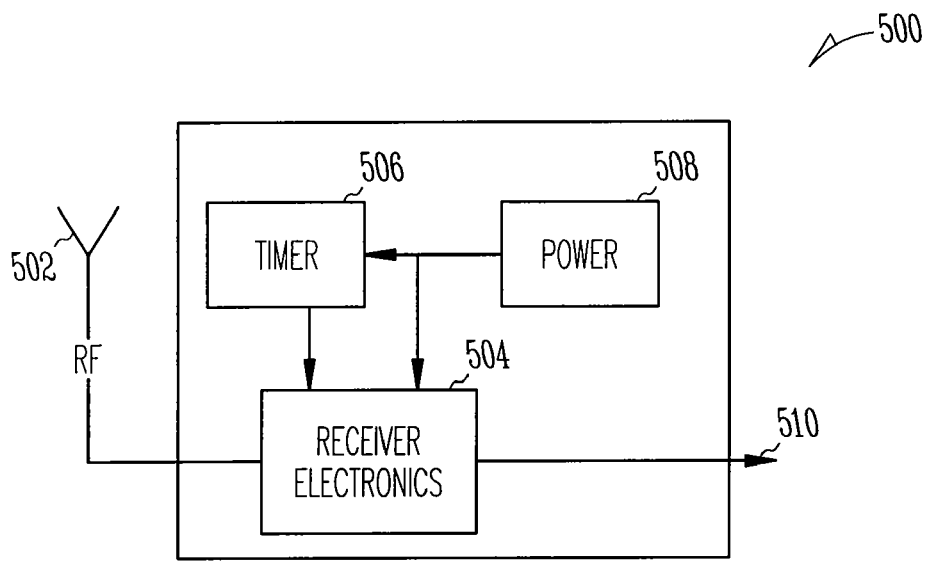
FIG. 5 shows one example of a receiver with timer according to one embodiment of the present subject matter.

One embodiment of such design is shown in the simplified block diagram of the system 500 of FIG. 5. Radio signals are received by antenna 502 and processed by a receiver having the automatic gain control as set forth herein 504. A timer 506 and power supply 508 are connected to the receiver 504. The resulting demodulated signal is 510, which may be analog or digital in nature. This simplified block diagram provides that the timer 506 will provide a signal to the receiver to perform sleep cycles and thus conserve power from the power supply 508.

Figure 6:
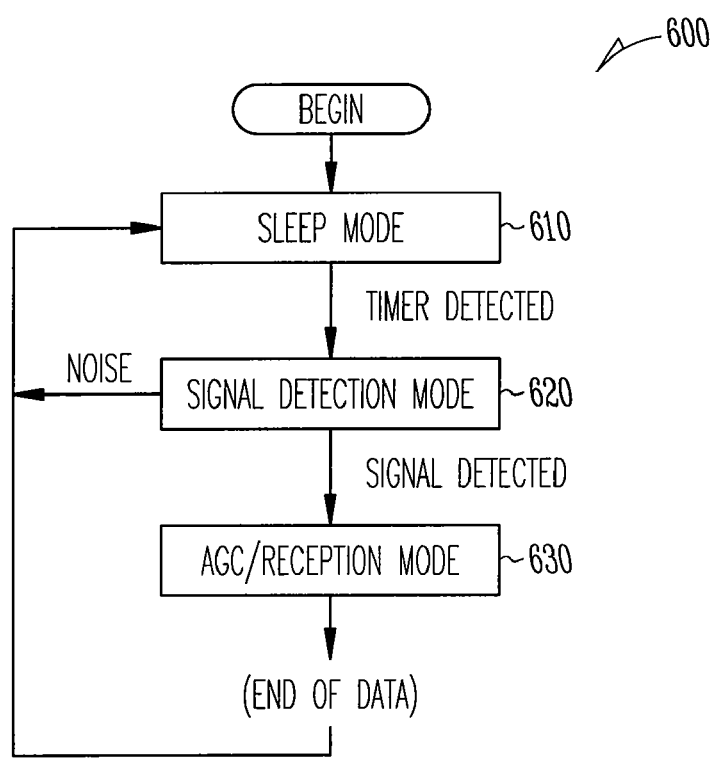
FIG. 6 shows one example of a low power receiver routine 600 using the receiver of FIG. 5 according to one embodiment of the present subject matter.

FIG. 6 shows one example of a low power receiver routine 600 using the receiver of FIG. 5, according to one embodiment of the present subject matter. The receiver 500 leaves sleep mode 610 upon detection of a timer event from timer 506. In varying embodiments, the timer 506 is programmed to provide a signal to receiver electronics 504 on regular intervals. For instance, the timer 506 may be programmed to wake up receiver 504 every 250 milliseconds. Other times are possible without departing from the present subject matter. One possible consideration for the timer frequency is to ensure that the receiver is activated in times short enough to detect important transmissions, yet provide down time to conserve power.

Upon wake up, the receiver electronics 504 search for a signal detection 620. This is accomplished by detection of energy by the information band detector. In FIG. 2 this equates to a detection of either state 2 or state 4 indicating good signal being received. In such cases, the flow transfers to the AGC/Reception Mode 630. If this is not the case, indicating no signal is present, the receiver will return to sleep mode 610.

Upon entering AGC/Reception Mode 630, the receiver will adjust gain appropriately for receiving data. After end of data is detected, or the absence of signal is detected, the receiver will reenter sleep mode 610.

Other process steps and acts and combinations thereof are possible without departing from the scope of the present subject matter.

A number of processes can be employed in the AGC/Reception Mode. One such process is:

Detect a wideband signal reading and an information band signal reading until either the wideband signal reading exceeds a first predetermined threshold or the information band signal reading exceeds a second predetermined threshold.

Monitor and store the value of the information band signal for a plurality of gain settings of the LNA.

Find the gain, G', corresponding to the highest value of the information band signal.

Compare the highest value of the information band signal to the second predetermined threshold.

If it is less than the threshold, then deem the input signal to include an out of band blocker and ignore it, since the inband data is not intelligible.

If it is greater than or equal to the threshold, then detect the input signal at the gain G' until such time as the information band signal is less than the second threshold for a predetermined duration, at which time control goes back to the "Detect" action, above.

Note that the programmable duration is typically on the order of N data symbols.

It is understood that various numbers of gains can be used. In one embodiment, 5 gain settings of the LNA are used. Other numbers are possible without departing from the scope of the present subject matter. In the embodiments featuring peak detectors and envelope detectors, it is understood that these detectors relate to wideband detectors and information band detectors, respectively. The following pseudocode accounts for the peak and envelope detector approach:

Gain Control Pseudocode According to Various Embodiments

Begin
1) Set the gain of the LNA to a maximum gain (in one embodiment a predetermined signal level is set instead).
2) Detect a Peak Signal P or Detect an Envelope Signal E of an Input Signal I
3) If P<Tp and E<Te, then go to the detect (above) again, else
   Monitor and store the Envelope Signal for a plurality of input gains [E(G, t)]
   Take the maximum E(G, t) of the plurality (Em=E(G',t)) where gain G' corresponds to the highest Em
   Compare the maximum Em to the same threshold Te
      If Em<Te, then deem the Input Signal I to be an out of band blocker and ignore resulting input signal I since there is no inband data, OR
      If Em is greater than or equal to Te, then Detect the Input Signal at an input gain G' until such time as E(G',t)<Te for a programmable duration (typically on the order of N symbols), and which time the loop starts again at 1), above.

In various embodiments, the present system adjusts gain to maximize signal to noise ratio of the information band. When reaching the proper gain the effect of the blocker will minimize.

Figure 7:
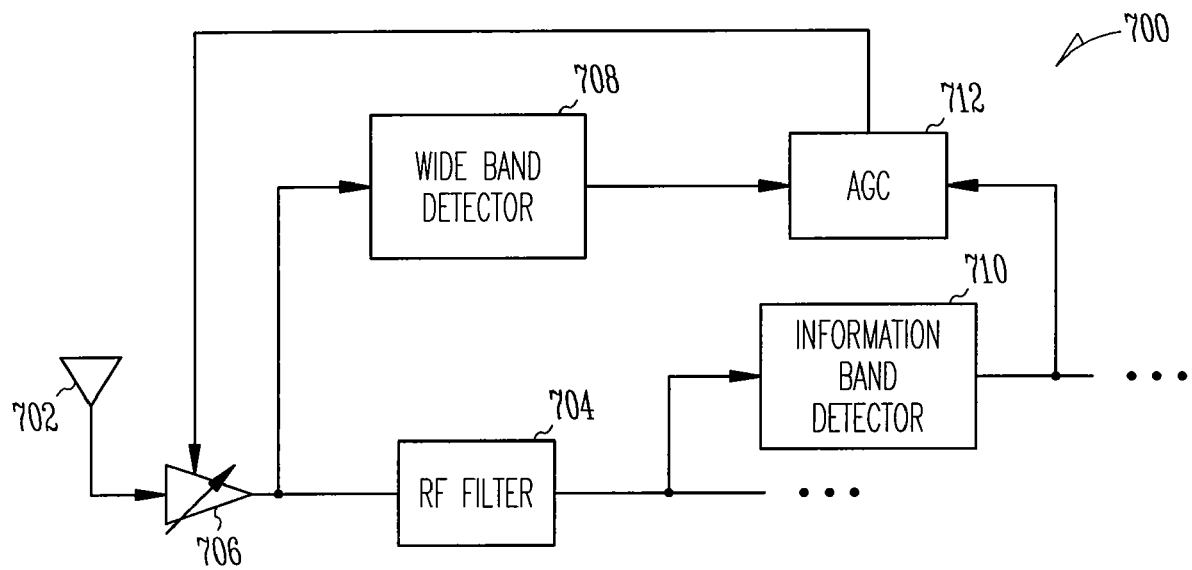
FIG. 7 shows one example application of the present subject matter in a receiver according to one embodiment of the present subject matter.

FIG. 7 shows one application of the present subject matter including an RF receiver according to one embodiment of the present subject matter. Receiver 700 includes an antenna 702 connected to LNA 706. A wideband detector 708 and bandpass filter 704 receive the output of the LNA 706. An information band detector 710 receives the output of the filter 704. The outputs of the wideband detector 708 and information band detector 710 are input to AGC 712. The output of AGC 712 controls LNA 706. The outputs of the filter 704, information band detector 710, and wideband detector 708 can be further used and demodulated by the receiver circuitry.

Figure 8:
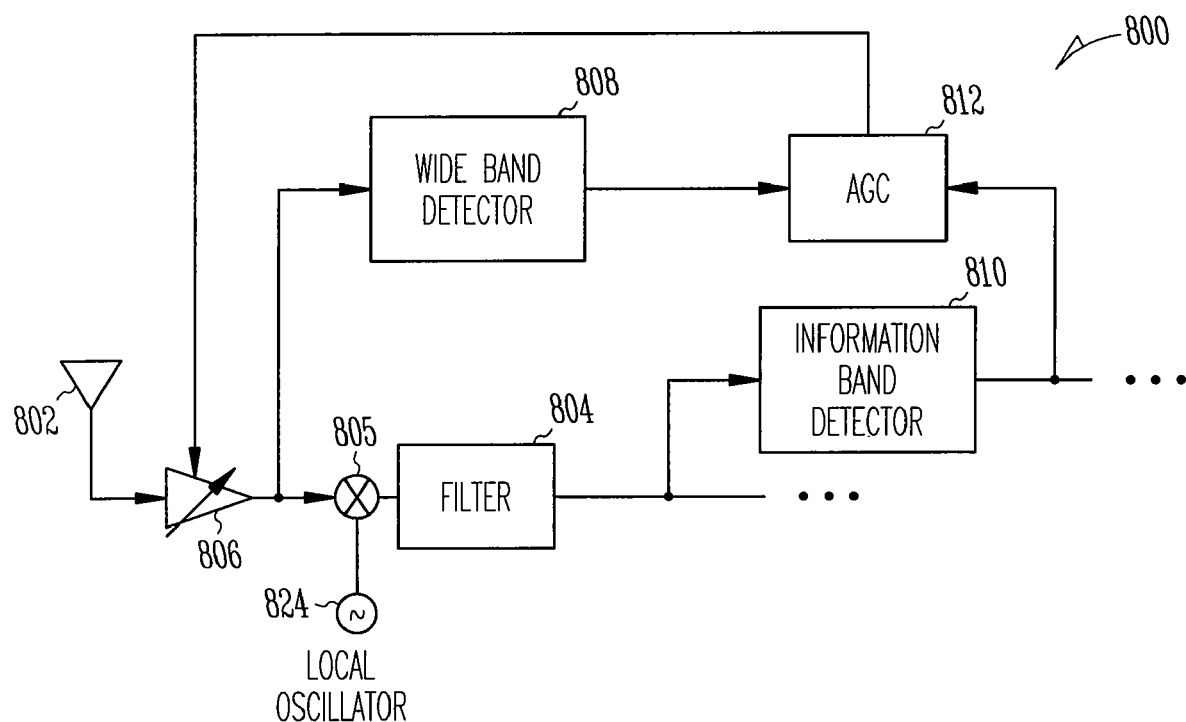
FIG. 8 shows one example application of the present subject matter in a receiver according to one embodiment of the present subject matter.

FIG. 8 shows one application of the present subject matter including an RF receiver according to one embodiment of the present subject matter. Receiver 800 includes an antenna 802 connected to LNA 806. A wideband detector 808 and mixer 805 receive the output of the LNA 806. Mixer 805 mixes the signal from local oscillator 824 and the output of LNA 806 to provide a signal to filter 804. An information band detector 810 receives the output of the filter 804. The outputs of the wideband detector 808 and information band detector 810 are input to AGC 812. The output of AGC 812 controls LNA 806. The outputs of the filter 804, information band detector 810, and wideband detector 808 can be further used and demodulated by the receiver circuitry.

Figure 9:
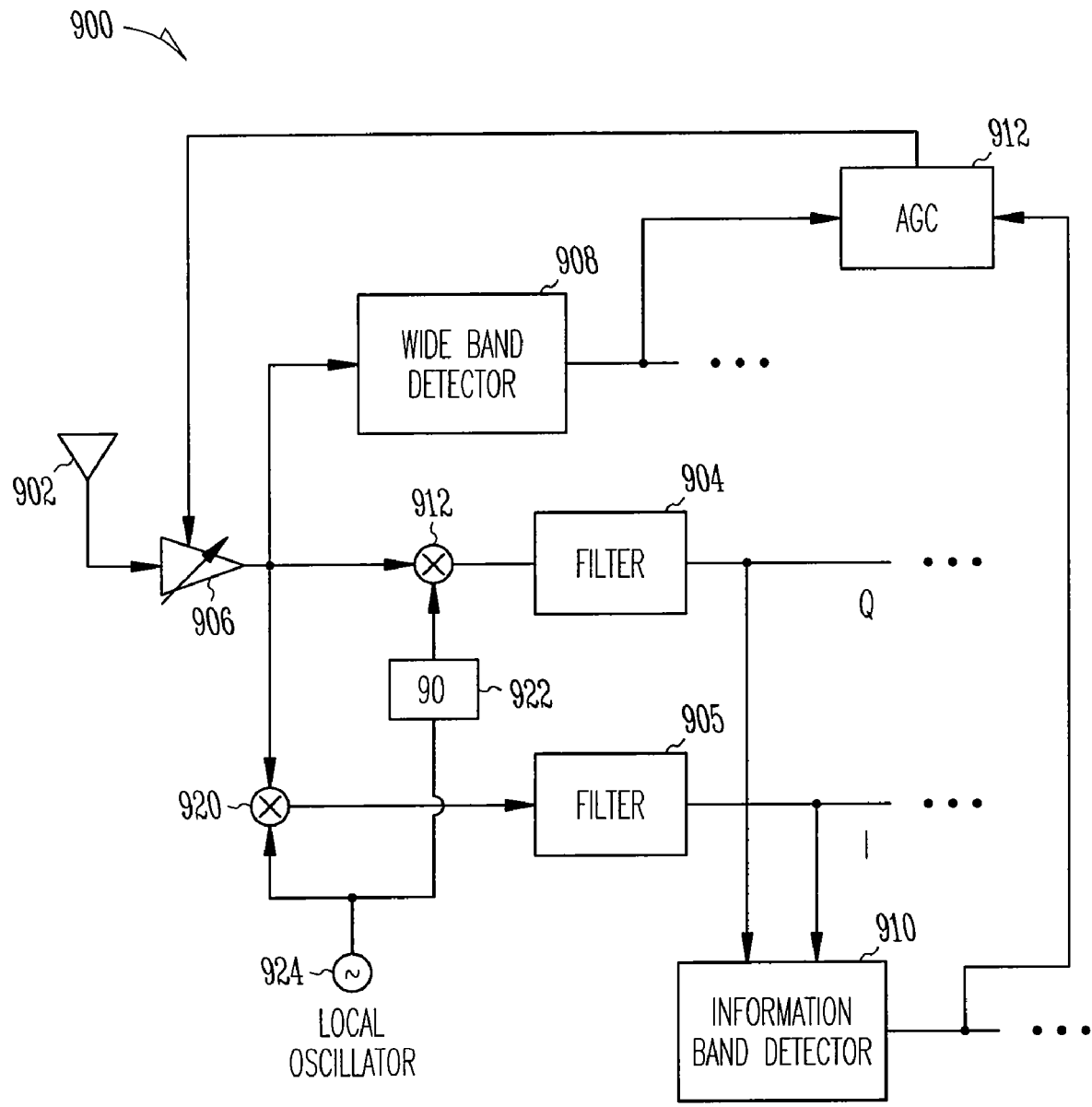
FIG. 9 shows one example application of the present subject matter including a direct conversion receiver to DC according to one embodiment of the present subject matter.

Another variation of receiver design is shown in FIG. 9. FIG. 9 shows one application of the present subject matter including either a direct conversion receiver (also known as a base-band receiver) to DC (also known as base-band) or to an intermediate frequency (IF) according to various embodiments and applications of the present subject matter. The antenna 902 of system 900 provides a signal to LNA 906. The output of LNA 906 is received by wideband detector 908, mixer 912 and mixer 920. Mixer 912 mixes the output of the LNA 906 with a 90 degree phase shifted signal from local oscillator 924. The output of mixer 912 is sent to a low-pass or band-pass filter 904. The output of the filter 904 is the quadrature (imaginary) or Q component of the received signal for use by the receiver electronics. Mixer 920 mixes the output of LNA 906 and a local oscillator signal from local oscillator 924 and supplies it to filter 905 to provide the in-phase (real) or I component of the received signal for use by the receiver electronics. In various embodiments, a demodulator (not shown) processes the signals received from the low-pass or band-pass filters 904 (Q) and 905 (I). The I and Q signals are also presented to the information band detector 910. The outputs of wideband detector 908 and information band detector 910 are input into AGC 912. The output of AGC 912 is used to control LNA 906.

The receiver designs of FIGS. 7, 8 and 9 are shown to provide some examples of receiver front end approaches which may employ the present subject matter. Other receiver designs may be employed without departing from the scope of the present applications.

Figure 10:
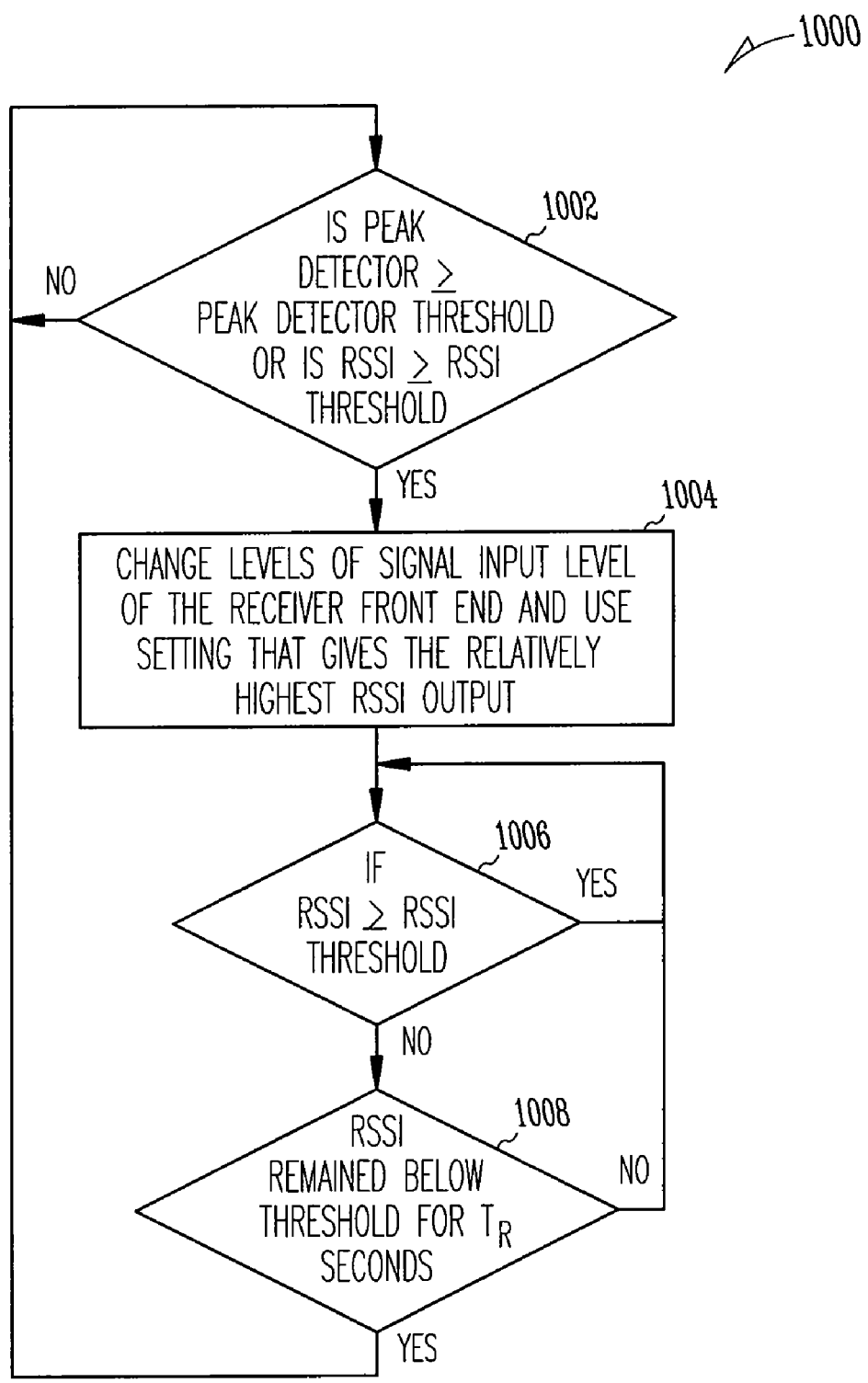
FIG. 10 shows one example of an automatic gain control flow chart according to one embodiment of the present subject matter.

FIG. 10 shows one embodiment of an automatic gain control process 1000 according to one embodiment of the automatic gain controls shown in the examples set forth in the present subject matter. In this embodiment, the system employs a received signal strength indicator (RSSI) to serve as an information band detector. A peak detector is used to serve as a wideband detector.

According to one embodiment, the process loops back to the first step 1002 unless either the peak detector output is greater than or equal to a predetermined peak detector threshold or the RSSI output is greater than or equal to a predetermined RSSI threshold. If either condition is true, then the process continues to the next step 1002. At step 1004 the process changes levels of the signal input level of the receiver front end and employs a setting which yields the relatively highest RSSI output attained 1004. Then the process monitors RSSI level to ensure that it is greater than or equal to the predetermined RSSI threshold 1006. The process loops until the RSSI output is no longer greater than or equal to the predetermined RSSI threshold and then proceeds to make sure that the RSSI output is below the RSSI threshold for a predetermined amount of time $T_r$ 1008. The process goes to 1002 if the RSSI output remains below the RSSI threshold for the $T_r$ interval. If at any time during the $T_r$ interval, the RSSI output exceeds the RSSI threshold the process loops to 1006. This can occur, for example, when receiving signals at or near the sensitivity level of the receiver. At such levels, signal loss can occur due to short term disturbances of the received signal, such as from mutipath fading. Thus, the timer avoids premature termination of reception of an incoming signal arising from operation near the sensitivity level of the receiver. Other processes are possible without departing from the scope of the present subject matter.

For example, it is understood that although the embodiments set forth show an LNA which incorporates a variable gain control function, other embodiments can be realized using one or more attenuators in conjunction with the LNA to control input signal level of the receiver front end. Such embodiments may include, but are not limited to, an attenuator before the LNA. Such embodiments may include, but are not limited to, an attenuator after the LNA. Other arrangements of variable gain amplifiers, fixed amplifiers, and attenuators may be employed without departing from the scope of the present subject matter.

In various embodiments, process steps perform comparisons as "greater than or equal to." It is understood that in certain embodiments comparisons using "greater than" may be employed without departing from the scope of the present subject matter. In various embodiments, process steps perform comparisons as "less than or equal to." It is understood that in certain embodiments comparisons using "less than" may be employed without departing from the scope of the present subject matter. The present subject disclosure contemplates such variations.

Although specific embodiments have been illustrated and described herein, it will be appreciated by those of ordinary skill in the art that other embodiments are possible without departing from the scope of the present subject matter.

What is claimed is:

1. A method of receiving an input signal using a receiver, comprising:
    detecting a peak of the input signal;
    detecting an envelope of the input signal;
    comparing the peak to a first threshold Tp;
    comparing the envelope to a second threshold Te; and
    if the peak is above the first threshold and the envelope is below the second threshold, then deeming the input signal to be affected by an out-of-band blocking signal and entering the receiver into a low power consumption state.

2. The method of claim 1, further comprising:
    if the envelope is above the second threshold, then applying gain control to decode information encoded in the input signal.

3. The method of claim 1, wherein the applying includes reducing gain of a receiver front end when the peak is above the first threshold.

4. The method of claim 1, comprising:
    if the peak is above the first threshold and the envelope is below the second threshold, then lowering the gain of the amplifier to decrease the possibility of overloading and to increase the signal-to-noise ratio of the input signal.

5. The method of claim 1, comprising;
    if the peak is below the first threshold and the envelope is below the second threshold, then increasing the gain of the amplifier.

6. The method of claim 1, comprising:
    if the envelope is above the second threshold, then lowering or raising the gain of the amplifier as needed to maximize signal-to-noise ratio.

7. The method of claim 1, comprising:
    entering a low power consumption state between pauses in the input signal.

8. The method of claim 1, further comprising:
    if the envelope is below the second threshold, entering a low power consumption state.

9. A method of receiving an input signal with a receiver, comprising:
    detecting a peak of the input signal;
    detecting an envelope of the input signal;

comparing the peak to a first threshold Tp;
comparing the envelope to a second threshold Te; and
if the peak is above the first threshold and the envelope is below the second threshold, then ignoring the input signal and entering the receiver into a low power consumption state.

10. The method of claim 9, further comprising:
if the peak is below the first threshold or the envelope is above the second threshold, detecting information encoded in the input signal.

11. The method of claim 10, wherein the detecting information further comprises applying gain control.

12. The method of claim 11, wherein the applying includes reducing gain of a receiver front end when the peak is above the first threshold.

13. The method of claim 9, further comprising:
if the peak is above the first threshold and the envelope is below the second threshold, then lowering the gain of the amplifier to decrease the possibility of overloading and to increase the signal-to-noise ratio of the envelope signal.

14. The method of claim 9, further comprising:
if the peak is below the first threshold and the envelope is below the second threshold, then increasing the gain of the amplifier.

15. The method of claim 9, further comprising:
if the envelope is above the second threshold, then lowering or raising the gain of the amplifier as needed to maximize signal-to-noise ratio.

16. The method of claim 9, comprising:
entering a low power consumption state between pauses in the information encoded in the input signal.

17. The method of claim 9, further comprising:
if the envelope is below the second threshold entering a low power consumption state.

18. An apparatus, comprising:
a receiver, including
a receiver front end;
a receiver intermediate frequency stage;
a peak detector adapted to receive signals from the receiver front end; and
an envelope detector adapted to receive signals from the receiver intermediate frequency stage,
wherein the receiver is adapted to recognize an out of band blocking signal based on outputs from the peak detector and the envelope detector, and wherein the receiver is adapted to enter a low power consumption state upon recognition of the out of band blocking signal.

19. The apparatus of claim 18, further comprising:
an automatic gain control processor adapted to adjust gain based on received outputs of the peak detector and the envelope detector.

20. The apparatus of claim 18, comprising:
wherein the receiver includes a timer adapted to provide a wakeup signal to the receiver on regular intervals, wherein upon wakeup the receiver is adapted to recognize an out of band blocking signal.

21. The apparatus of claim 20, comprising:
wherein the receiver is adapted to detect a signal upon wakeup.

22. The apparatus of claim 18, comprising:
wherein the receiver is adapted to enter a low power consumption state upon detection of an output of the envelope detector that is below a threshold.

23. The apparatus of claim 18, comprising:
wherein the receiver is adapted to enter a low power consumption state upon detection of a signal.

24. An apparatus, comprising:
a receiver, including:
a receiver front end;
a peak detector adapted to receive signals from the receiver front end;
a filter stage following the receiver front end; and
an envelope detector adapted to receive signals from the filter stage,
wherein the receiver is adapted to recognize an out of band blocking signal based on outputs from the peak detector and the envelope detector, and
wherein the receiver is adapted to enter a low power consumption state upon recognition of the out of band blocking signal.

25. The apparatus of claim 24, further comprising:
an automatic gain control processor adapted to adjust gain using outputs of the peak detector and the envelope detector.

26. The apparatus of claim 24, further comprising:
a timer adapted to provide a wakeup signal to the receiver on regular intervals, wherein upon wakeup the receiver is adapted to recognize an out of band blocking signal.

27. The apparatus of claim 26, comprising:
wherein the receiver is adapted to detect a signal upon wakeup.

28. The apparatus of claim 24, comprising:
wherein the receiver is adapted to enter a low power consumption state upon detection of an ouput of the envelope detector that is below a threshold, 29. The apparatus of claim 24, comprising:
wherein the receiver is adapted to enter a low power consumption state upon detection of a signal.

30. The apparatus of claim 24, further comprising:
a receiver base-band stage, and
wherein the envelope detector is adapted to receive signals from the base-band stage.

* * * * *

UNITED STATES PATENT AND TRADEMARK OFFICE
CERTIFICATE OF CORRECTION

PATENT NO. : 7,664,211 B2  Page 1 of 1
APPLICATION NO. : 11/539524
DATED : February 16, 2010
INVENTOR(S) : Jeffrey P. Solum It is certified that error appears in the above-identified patent and that said Letters Patent is hereby corrected as shown below:

In column 12, line 50, in Claim 5, delete "comprising;" and insert -- comprising: --, therefor.

In column 13, line 22, in Claim 14, delete "comprising;" and insert -- comprising: --, therefor.

In column 13, line 37, in Claim 18, delete "including" and insert -- including: --, therefor.

In column 14, line 43, in Claim 28, delete "ouput" and insert -- output --, therefor.

In column 14, line 44, in Claim 28, delete "threshold," and insert -- threshold. --, therefor.

Signed and Sealed this

Twenty-fifth Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,664,211 B2 Page 1 of 1
APPLICATION NO. : 11/539524
DATED : February 16, 2010
INVENTOR(S) : Jeffrey Paul Solum It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 732 days.

Signed and Sealed this

Twenty-fourth Day of August, 2010

David J. Kappos
*Director of the United States Patent and Trademark Office*